(12) United States Patent
Igarashi et al.

(10) Patent No.: US 7,045,393 B2
(45) Date of Patent: *May 16, 2006

(54) METHOD FOR MANUFACTURING CIRCUIT DEVICES

(75) Inventors: Yusuke Igarashi, Gunma (JP); Noriaki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 112 days.

This patent is subject to a terminal disclaimer.

(21) Appl. No.: 10/668,492

(22) Filed: Sep. 23, 2003

(65) Prior Publication Data

US 2004/0106235 A1    Jun. 3, 2004

(30) Foreign Application Priority Data

Sep. 26, 2002   (JP)    .................... P. 2002-281889

(51) Int. Cl.
  *H01L 21/44*   (2006.01)
(52) U.S. Cl. ..................... 438/112; 438/612
(58) Field of Classification Search ........ 438/106–127, 438/612–617; 257/701, 702, 734, 736, 738, 257/750
  See application file for complete search history.

(56) References Cited

U.S. PATENT DOCUMENTS

| | | | |
|---|---|---|---|
| 6,664,138 B1 * | 12/2003 | Igarashi et al. | 438/126 |
| 6,720,209 B1 * | 4/2004 | Igarashi et al. | 438/126 |
| 2002/0084456 A1 * | 7/2002 | Sugihara et al. | 257/48 |
| 2004/0092129 A1 | 5/2004 | Igarashi et al. | |
| 2004/0097081 A1 | 5/2004 | Mizuhara et al. | |
| 2004/0097086 A1 | 5/2004 | Igarashi et al. | |
| 2004/0101995 A1 | 5/2004 | Sakai et al. | |
| 2004/0106288 A1 | 6/2004 | Igarashi et al. | |

FOREIGN PATENT DOCUMENTS

JP    2000-133678    5/2000

* cited by examiner

*Primary Examiner*—Brook Kebede
(74) *Attorney, Agent, or Firm*—Fish & Richardson P.C.

(57) ABSTRACT

Conventionally, semiconductor devices wherein a flexible sheet with a conductive pattern was employed as a supporting substrate, a semiconductor element was mounted thereon, and the ensemble was molded have been developed. In this case, problems occur that a multilayer wiring structure cannot be formed and warping of the insulating resin sheet in the manufacturing process is prominent. In order to solve these problems, a laminated plate (10) in which a thin first conductive film (11) and a thick second conductive film (12) have been laminated via a third conductive film (13) is used. In a step for forming a conductive wiring layer (11A) by etching the first conductive film (11), etching depth can be controlled by stopping etching at the third conductive film (13). Accordingly, forming the first conductive film (11) to be thin makes it possible to form the conductive wiring layer (11A) into a fine pattern.

19 Claims, 9 Drawing Sheets

METHOD FOR MANUFACTURING CIRCUIT DEVICES

BACKGROUND OF THE INVENTION

1. Field of the Invention

The present invention relates to a method for manufacturing circuit devices, and particularly, to a method for forming a circuit device using two conductive films laminated via a third conductive film to serve as a barrier layer in an etching step.

2. Description of the Related Art

In recent years, IC packages have increasingly been used in portable equipment and small-sized high-density mounting equipment, and conventional IC packages and mounting concepts have undergone drastic changes. This has been mentioned in, for example, Japanese Unexamined Patent Publication No. 2000-133678, which is a technique related to a semiconductor device employing a polyimide resin sheet of a flexible sheet as an example of its insulating resin sheet.

Figure 16:
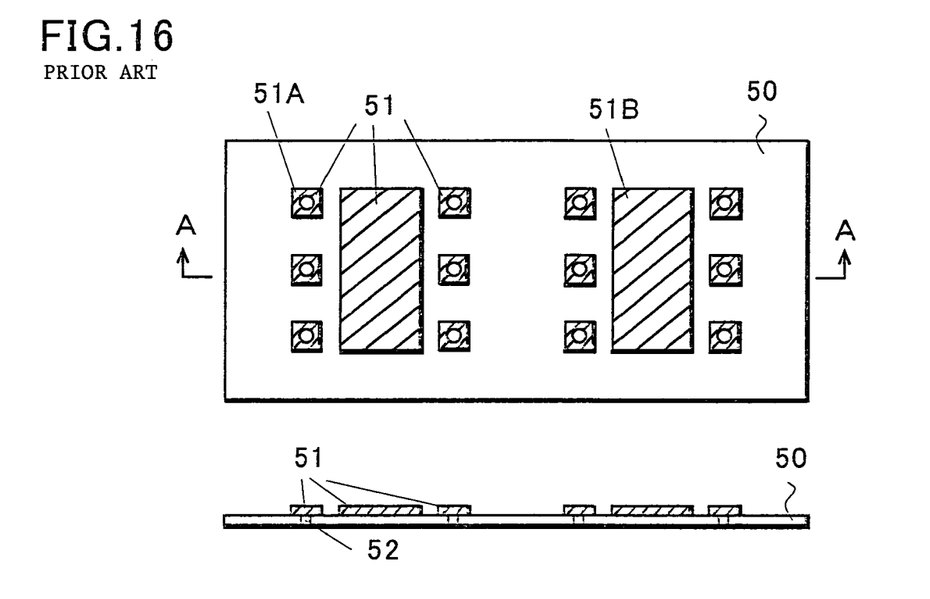
FIG. 16 is a view describing a conventional method for manufacturing semiconductor devices.
Figure 17:
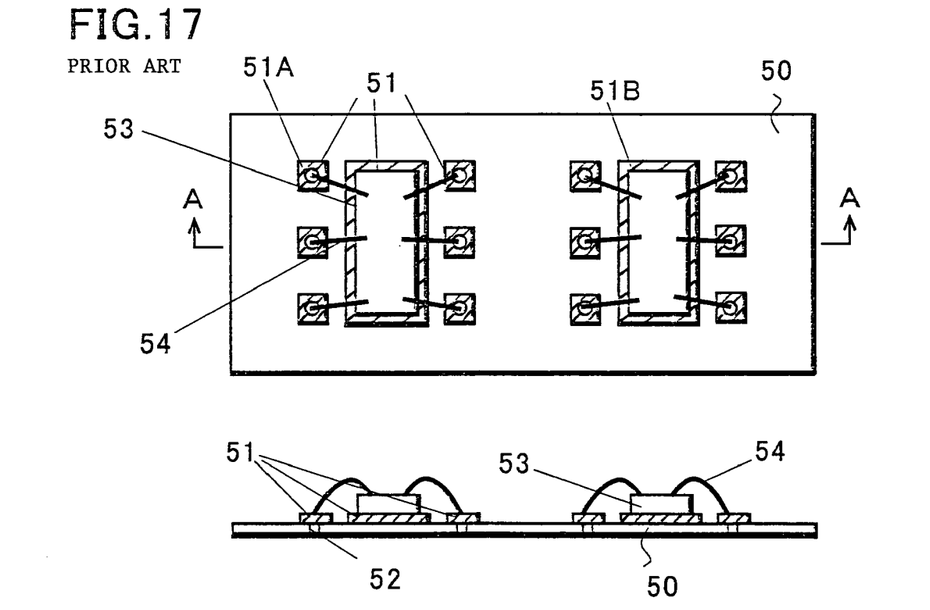
FIG. 17 is a view showing a conventional method for manufacturing semiconductor devices.

In FIG. 16 through FIG. 18, a flexible sheet 50 is employed as an interposer substrate. Herein, drawings shown in the upper part of the respective drawings are plan views, drawings shown in the lower part are sectional views along a line A—A.

First, on the flexible sheet 50 shown in FIG. 16, a copper foil pattern 51 is prepared by being adhered via an adhesive. This copper foil pattern 51 is different in its pattern depending on whether a semiconductor element to be mounted is a transistor or an IC, and in general, bonding pads 51A and an island 51B are formed. In addition, a symbol 52 shows an opening portion to lead out an electrode from the rear surface of the flexible sheet 50, and the copper foil pattern 51 is exposed therethrough.

Next, this flexible sheet 50 is transferred to a die bonder, and as shown in FIG. 17, semiconductor elements 53 are mounted. Thereafter, this flexible sheet 50 is transferred to a wire die bonder, and the bonding pads 51A and pads of the semiconductor elements 53 are electrically connected by metal wire 54.

Figure 18A:
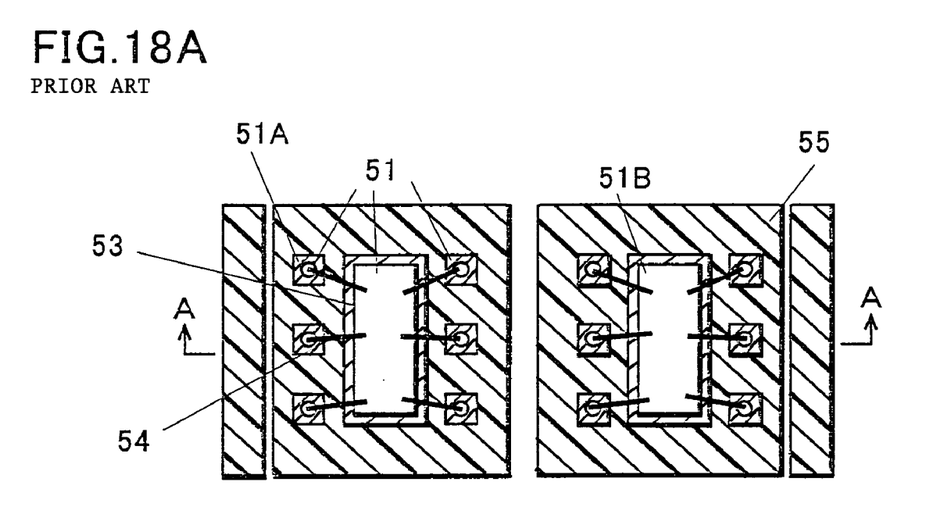
FIG. 18 is a view illustrating a conventional method for manufacturing semiconductor devices.

Lastly, as in FIG. 18A, a sealing resin 55 is provided on the front surface of the flexible sheet 50 for sealing. Herein, transfer molding is performed so as to cover the bonding pads 51A, island 51B, semiconductor element 53, and metal wires 54.

Figure 18B:
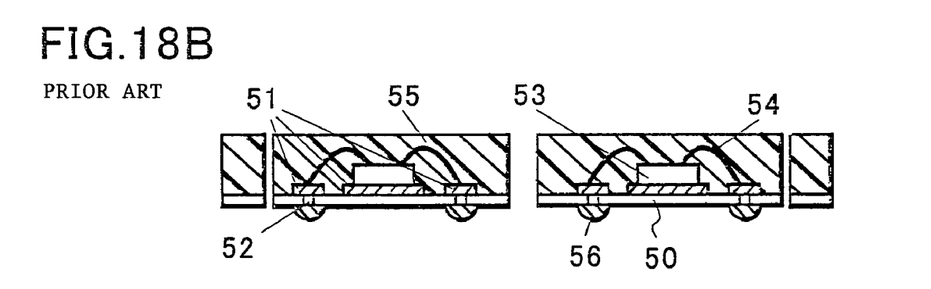

Thereafter, as shown in FIG. 18B, connecting means 56 such as solder or solder balls are provided, and as a result of a pass through a solder reflow furnace, spherical solder 56 fusion-bonded with the bonding pads 51A via the opening portions 52 are formed. In addition, since the semiconductor elements 53 are formed in a matrix shape on the flexible sheet 50, dicing is performed as in FIG. 17 to separate the semiconductor elements individually.

Figure 18C:
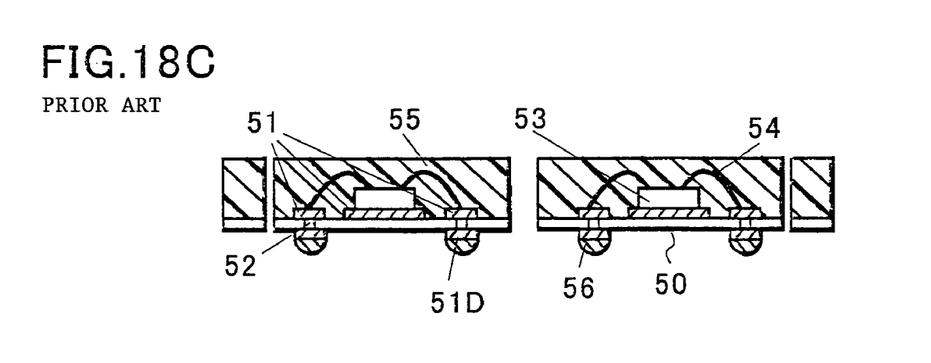

In addition, in the sectional view shown in FIG. 18C, 51A and 51D are formed as electrodes on both surfaces of the flexible sheet 50. In general, this flexible sheet 50 is supplied after patterning of both surfaces by a manufacturer.

A semiconductor device using the above-described flexible sheet 50 uses no widely-known metal frame and, therefore, has an advantage such that an extremely small-sized low-profile package can be realized, however, substantially, wiring is carried out by only one-layer copper pattern 51 provided on the front surface of the flexible sheet 50. Therein exists a problem such that, since the flexible sheet is flexible, distortion occurs before and after a pattern formation of a conductive film, and this is not suitable for a multilayer wiring structure since displacement between laminated layers is great.

In order to improve supporting strength to suppress the sheet distortion, it is necessary to sufficiently thicken the flexible sheet 50 to approximately 200 μm, and this goes against a reduction in thickness.

Furthermore, in terms of a manufacturing method, in the aforementioned manufacturing devices, for example, in the die bonder, wire bonder, transfer molding device, reflow furnace, etc., the flexible sheet 50 is transferred and attached to a part called a stage or a table.

Figure 19:
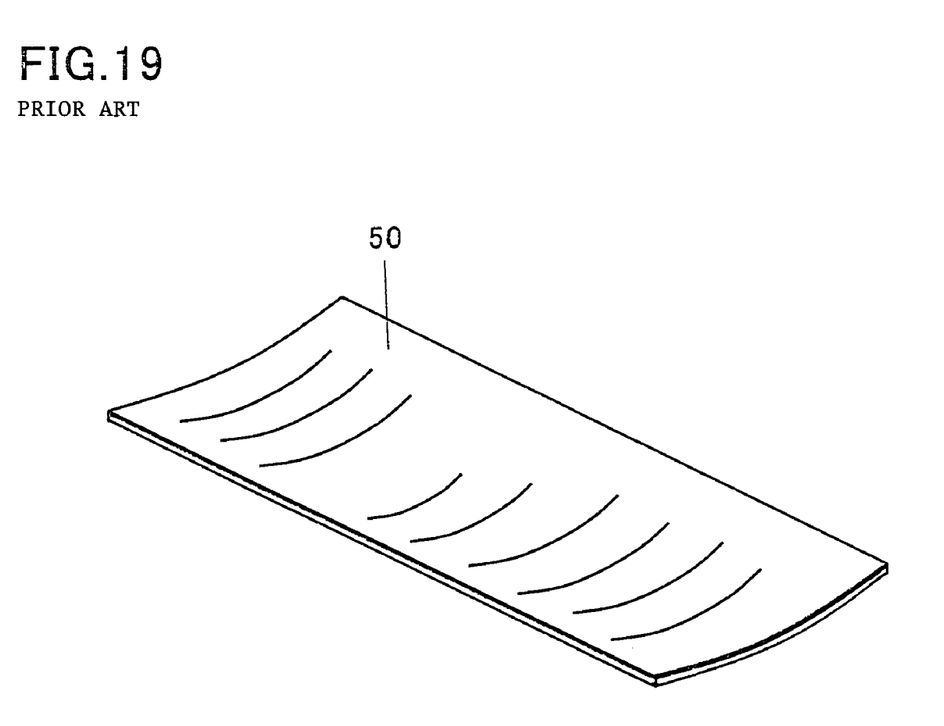
FIG. 19 is a view describing a flexible sheet used in the related art.

However, when the thickness of an insulating resin to serve as a base of the flexible sheet 50 can be reduced to approximately 50 μm, if the thickness of the copper foil pattern 51 formed on the front surface can be also thin such as 9–35 μm, transferring characteristics are considerably inferior due to warping as shown in FIG. 19, and attaching characteristics to the aforementioned stage or table are inferior, therein exists a drawback. This is considered to be warping owing to that the insulating resin itself is considerably thin and warping owing to a difference in the thermal expansion coefficient between the copper foil pattern 51 and insulating resin.

In addition, since the part of the opening portions 52 is pressured from the upside during molding, a force to warp the circumferences of the bonding pads 51A upward may act to deteriorate the bonding pads 51A in adhesive properties.

In addition, if the resin material itself to form a flexible sheet 50 lacks flexibility or if a filler is mixed to enhance thermal conductivity, the flexible sheet 50 becomes rigid. In this condition, when bonding is performed by a wire bonder, the bonding part may crack. In addition, during transfer molding, the part where the metal mold is brought into contact may crack. This appears more prominently if warping exists as shown in FIG. 19.

Although the flexible sheet 50 described above is a flexible sheet on whose rear surface no electrode is formed, an electrode 51D may be formed, as shown in FIG. 21C, on the rear surface of the flexible sheet 50, as well. In this case, since the electrode 51D is brought into contact with the manufacturing devices or is brought into contact with the transferring surfaces of transferring means between the manufacturing devices, there exists a problem such that damage occurs to the rear surface of the electrode 51D. Since the electrode is formed with this damage included, there also exist problems, such that the electrode 51D itself cracks afterward by a heat application and solder wettability declines in a solder connection to a motherboard.

In addition, during transfer molding, a problem also occurs such that a sufficient sealing structure cannot be realized because of weak adhesive properties between the flexible sheet 50 and copper foil pattern 51 and the insulating resin.

SUMMARY OF THE INVENTION

In order to solve such problems, the inventors have proposed using a laminated plate formed by laminating a thin, first conductive film and a thick, second conductive film via a third conductive film.

An object of the preferred embodiments is to provide a method for manufacturing circuit devices comprising: a step for preparing a laminated plate by laminating a first conductive film and a second conductive film via a third conductive film; a step for forming a conductive wiring layer by etching the first conductive film into a desirable pattern;

a step for covering front-surface portions of the second conductive film exposed by removing the third conductive film, the conductive wiring layer, and end faces of the third conductive film with an insulating layer; a step for partially exposing the conductive wiring layer by removing a part of the insulating layer; a step for fixedly fitting semiconductor elements onto the insulating layer and electrically connecting the semiconductor elements with the conductive wiring layer; a step for covering the semiconductor elements with a sealing resin layer; a step for removing the second conductive film to expose the third conductive film on the rear surface; and a step for forming external electrodes at desirable positions of the third conductive film.

It is a further object of the preferred embodiments to provide a conductive wiring layer which is formed to be fine by performing etching up to the third conductive film.

It is an additional object of the preferred embodiments to provide a solution which is used to etch the first conductive film.

It is another object of the preferred embodiments to provide as the solution for performing the etching, a solution containing ferric chloride or cupric chloride.

Another object of the preferred embodiments is to provide a third conductive film which is removed by electrolytic peeling.

Yet another object of the preferred embodiments is to provide a third conductive film which is removed by etching by use of a solution to etch the third conductive film.

A further object of the preferred embodiments is to provide a solution which is an iodine-based solution.

Still another object of the preferred embodiments is to provide a second conductive film which is entirely etched.

A further object of the preferred embodiments is to provide a second conductive film which is formed to be thicker than the first conductive film.

It is yet another object of the preferred embodiments to provide an insulating layer which can be a thermoplastic resin, a thermosetting resin, or a photosensitive resin.

It is another object of the preferred embodiments to provide a first conductive film and a second conductive film which are metals made of copper as a main material, and a third conductive film which is a metal made of silver as a main material.

It is an additional object of the preferred embodiments to provide a laminated plate which is manufactured by laminating the third conductive film and the first conductive film by electroplating while using the second conductive film as a base.

Another object of the preferred embodiments is to provide a laminated plate which is formed by rolling.

A further object of the preferred embodiments is to provide exposed and plated first conductive film parts and electronic components, excluding semiconductor elements, which are electrically connected.

An additional object of the preferred embodiments is to provide an insulating layer which is formed by vacuum press or vacuum lamination.

Yet another object of the preferred embodiments is to provide an insulating layer which is partially removed by laser processing.

It is a further object of the preferred embodiments to provide an insulating layer which is partially removed by a lithographic method.

It is another object of the preferred embodiments to provide a plated layer formed on the exposed parts of the conductive wiring layer by electrolytic plating using the second conductive layer as an electrode.

As described above, by forming the first conductive film thin and using the third conductive film as a barrier layer, the conductive wiring layer, which is formed by partially removing the first conductive film, can be formed fine. For example, in a case where copper is employed as a first conductive film, and silver is employed as a third conductive film, when the first conductive film is etched by use of a solution containing ferric chloride or cupric chloride, the silver functions as a barrier layer without being etched.

Furthermore, in the preferred embodiments, the third conductive film is partially removed by use of a conductive wiring layer 11A formed by partially removing the first conductive film as a mask. This partial removal of the third conductive film can be carried out by etching or electrolytic peeling. When the third conductive film is partially removed by etching, an etchant different from that used to remove the first conductive film is used.

According to the preferred embodiments, in the step for forming the conductive wiring layer 11A by etching the thinly formed first conductive film 11, etching can be stopped at a predetermined depth by providing the third conductive film 13 as a barrier layer. Accordingly, an advantage is provided such that the conductive wiring layer 11A can be formed to be fine by thinly forming the first conductive film 11.

Moreover, in the step for entirely removing the second conductive film 12 by etching from the rear surface, the third conductive film 13 functions as a barrier layer, whereby the rear surface composed of the insulating layer 15 and the third conductive film exposed therethrough can be formed flat, therein exists an advantage. Thus, flatness of the rear surface of the circuit device of a finished product can be improved, therefore, quality of the same can be improved.

DESCRIPTION OF THE PREFERRED EMBODIMENTS

A method for manufacturing circuit devices of the preferred embodiments will be described in detail with reference to FIG. 1 through FIG. 15.

A method for manufacturing circuit devices of the preferred embodiments comprises: a step for preparing a laminated plate by laminating a first conductive film 11 and a second conductive film 12 via a third conductive film 13; a step for forming a conductive wiring layer 11A by etching the first conductive film 11 into a desirable pattern; a step for removing the third conductive film 13 by use of said conductive film by use of the conductive wiring layer 11A as a mask; a step for covering front-surface portions of the second conductive film 12 exposed by removing the third conductive film 13, end faces the conductive wiring layer 11A and of the third conductive film 13 with an insulating layer 15; a step for partially exposing the conductive wiring layer 11A by removing a part of the insulating layer 15; a step for fixedly fitting semiconductor elements onto the insulating layer and electrically connecting the semiconductor elements 19 with the conductive wiring layer 11A; a step for covering the semiconductor elements with a sealing resin layer; a step for removing the second conductive film 12 to expose the third conductive film 13 on the rear surface; and a step for forming external electrodes 24 at desirable positions of the third conductive film 13. Such respective steps will be described in the following.

Figure 1:
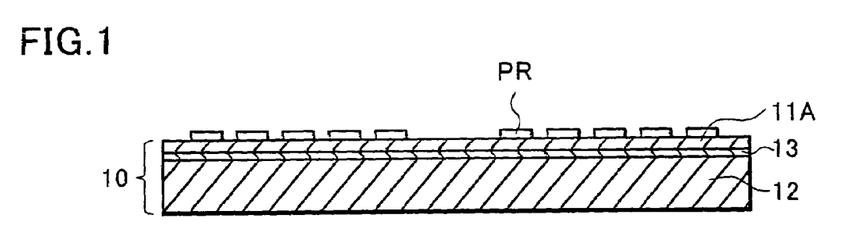
FIG. 1 is a sectional view describing a method for manufacturing circuit devices of the preferred embodiments.

The first step of the preferred embodiments is, as shown in FIG. 1, for preparing a laminated plate 10 by laminating a thin, first conductive film 11 and a thick, second conductive film 12 via a third conductive film 13.

On the front surface of the laminated plate 10, the first conductive film 11 is formed substantially throughout the whole area, and the second conductive film 12 is formed substantially throughout the whole area of the rear surface via a third conductive film 13, as well. The first conductive film 11 and second conductive film 12 are, preferably, made of Cu as a main material or are composed of a widely-known lead frame material. The first conductive film 11, second conductive film 12, and third conductive film 13 can be formed by a plating method, an evaporation method, or a sputtering method, or a metal foil formed by a rolling method or a plating method can be adhered to the same. Moreover, as the first conductive film 11 and second conductive film 12, Al, Fe, Fe—Ni, a widely-known lead frame material or the like can be employed.

As the material of the third conductive film 13, a material is employed which is not etched by an etchant used when the first conductive film 11 and second conductive film 12 are removed. In addition, since external electrodes 24 of solder or the like are formed on the rear surface of the third conductive film 13, adhesion of the external electrodes 24 is also considered. Concretely, a conductive film composed of gold, silver, and palladium can be employed as a material of the third conductive film 13.

The first conductive film is formed thin in thickness to form a fine pattern, and the thickness can be approximately 5–35 82 m. The second conductive pattern is formed thick to mechanically support the whole, and the thickness can be approximately 70–200 µm. The third conductive film 13 functions as a barrier layer when the first conductive film 11 and second conductive film 12 are etched, and can be formed with a thickness of approximately 1–10 µm.

The preferred embodiments have an advantage that the second conductive film 12 is formed thicker than the first conductive film 11. The first conductive film can be formed with a thickness of approximately 5–35 µm and is formed as thin as possible so that a fine pattern can be formed. The second conductive film 12 can be sufficient with a thickness of approximately 70–200 µm, and provision of supporting strength is regarded as important.

Accordingly, by forming the second conductive film 12 thick, flatness of the laminated plate 10 can be maintained, whereby workability in the following steps can be improved.

Furthermore, the second conductive film 12 is damaged through various steps. However, the thick, second conductive film 12 is to be removed in a later step, so that damage is prevented from remaining in a circuit device. In addition, since the sealing resin can be hardened while flatness is maintained, the rear surface of a package can also be flattened, and the external electrodes formed on the rear surface of the laminated plate can also be arranged flat. Therefore, electrodes on a mounting substrate can be brought into contact with the electrodes on the rear surface of the laminated plate 10, whereby a soldering failure can be prevented.

Next, a concrete manufacturing method for the aforementioned laminated plate 10 will be described. A laminated plate 10 can be manufactured by lamination by electroplating or by rolling and joining. When a laminated plate 10 is manufactured by electroplating, first, a second conductive film 12 is prepared. Then, electrodes are provided on the rear surface of the second conductive film 12, and a third conductive film is laminated by an electrolytic plating method. Thereafter, similarly by an electrolytic plating method, a first conductive film is laminated on the third conductive film. When a laminated plate 10 is manufactured by rolling, a first conductive film 11, a second conductive film 12, and a third conductive film 13 which have been prepared in a plate shape are joined under pressure by a roll or the like.

Figure 2:
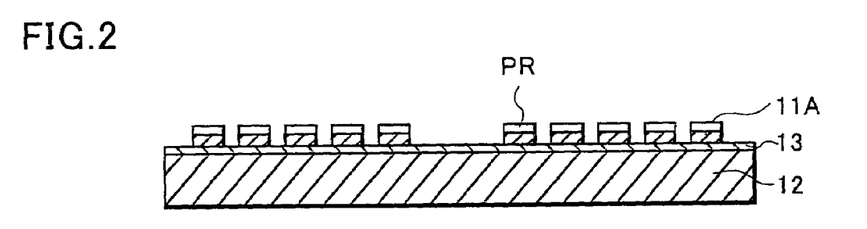
FIG. 2 is a sectional view showing a method for manufacturing circuit devices of the preferred embodiments.
Figure 3:
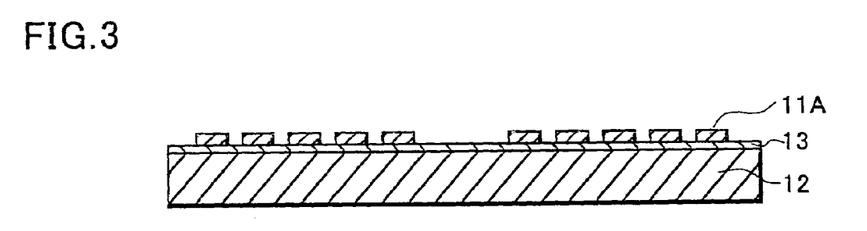
FIG. 3 is a sectional view illustrating a method for manufacturing circuit devices of the preferred embodiments.

The second step of the preferred embodiments is, as shown in FIG. 2 and FIG. 3, for forming a first conductive wiring layer 11A by etching the first conductive film 11 into a desirable pattern.

The first conductive film 11 is covered with a photoresist PR of a desirable pattern, and a conductive wiring layer 11A to form bonding pads and wiring is formed by chemical etching. Since the first conductive film 11 is made of Cu as a main material, ferric chloride or cupric chloride is sufficient as an etchant. As a result of etching of the first conductive film 11, the third conductive film 13 also comes into contact with the etchant, however, since the material for the third conductive film 13 is not etched by ferric chloride or cupric chloride, etching stops on the front surface of the third conductive film 13. Thus, since the first conductive film 11 has been formed with a thickness of approximately 5–35 µm, the first conductive wiring layer 11 can be formed into a fine pattern of 50 µm or less. In addition, as shown in FIG. 3, the resist PR is removed after the conductive wiring layer 11A is formed.

The preferred embodiments have an advantage that etching is stopped at the third conductive film 13 in a step for etching the first conductive film 11. The first conductive film 11 to be etched in this step is formed mainly of Cu, and ferric chloride or cupric chloride is used as an etchant to partially remove the Cu. In contrast thereto, since the third conductive film 13 is formed of a conductive material which is not etched by ferric chloride or cupric chloride, etching stops at the front surface of the third conductive film 13. As the material for the third conductive film 13, gold, silver or palladium can be employed.

Figure 4:
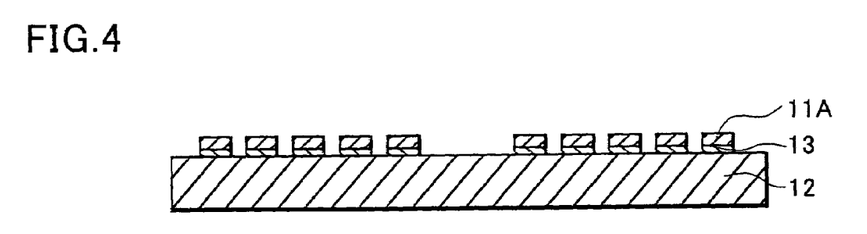
FIG. 4 is a sectional view depicting a method for manufacturing circuit devices of the preferred embodiments.

The third step of the preferred embodiments is, as shown in FIG. 4, for removing the third conductive film 13 by use of the conductive wiring layer 11A as a mask.

The third conductive film 13 is selectively removed by use of, as a mask, the conductive wiring layer 11A formed of the first conductive film 11 in the previous step. Two methods can be employed for selectively removing the third conductive film 13. A first method thereof is an etching method by use of a solution to remove only the third conductive film 13. A second method thereof is a method for removing only the third conductive film 13 by electrolytic peeling.

As the first method, a method for partially removing the third conductive film 13 by etching will be described. As an etchant used in this method, an etchant is employed which etches the third conductive film 13 and does not etch the conductive wiring layer 11A or second conductive film 12. For example, in a case where the conductive wiring layer 11A and second conductive film 12 are formed of a material mainly of Cu and the third conductive film 13 is an Ag film, only the third conductive film 13 can be removed by using an iodine-based etchant. As a result of etching of the third conductive film 13, the second conductive film 12 comes into contact with the iodine-based etchant, however, the second conductive film 12 made of, for example, Cu is not etched by the iodine-based etchant. Accordingly, etching herein performed stops at the front surface of the second conductive film 12. Therefore, the resist PR of FIG. 2 can be removed after this step.

As the second method, a method for removing only the third conductive film 13 by electrolytic peeling will be described. First, a solution containing metal ions is brought into contact with the third conductive film 13. Then, a positive electrode is provided in the solution, a negative electrode is provided on the laminated plate 10, and a direct current is applied. Thereby, only the third conductive film 13 is removed based on a principle reverse to that of plating film formation by an electrolytic method. The solution herein used is a solution used when the material composing the third conductive film 13 is plated. Accordingly, in this method, only the third conductive film 13 is peeled off.

Figure 5:
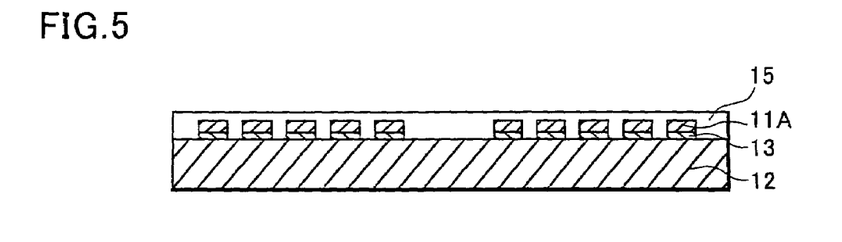
FIG. 5 is a sectional view showing a method for manufacturing circuit devices of the preferred embodiments.
Figure 6:
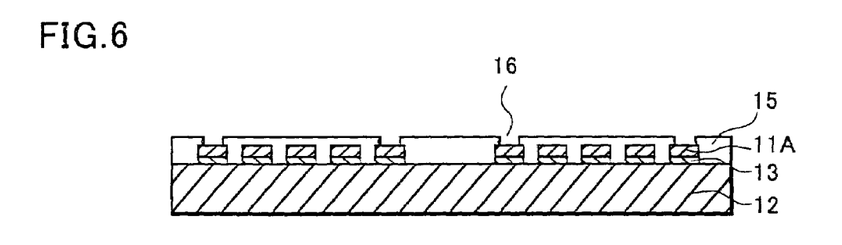
FIG. 6 is a sectional view illustrating a method for manufacturing circuit devices of the preferred embodiments.
Figure 7:
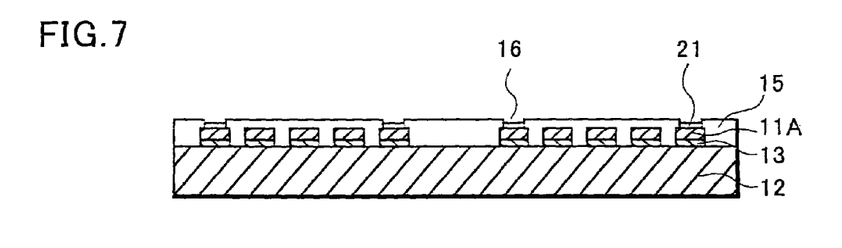
FIG. 7 is a sectional view illustrating a method for manufacturing circuit devices of the preferred embodiments.

The fourth step of the preferred embodiments is, with reference to FIG. 5 through FIG. 7, for covering the conductive wiring layer 11A and third conductive film 13 with an insulating layer 15.

Referring to FIG. 5, the third conductive film 13, conductive wiring layer 11A and the partially exposed surface of the second conductive film 12 are covered with an insulating layer film 15. Concretely, the upper faces and side faces (end faces) of the partially removed third conductive film 13 and conductive wiring layer 11A are covered with the insulating layer 15. In addition, the front surface of the partially exposed second conductive film 12 is also covered with the insulating layer 15. The process of covering with the insulating layer 15 of this step can be carried out by a vacuum press or laminating method. A vacuum press is a method for overlapping a prepreg sheet made of a thermosetting resin and pressing the same in vacuo, and a plurality of laminated sheets 10 can be batch processed. In a laminating method, a thermosetting resin or photosensitive resin sheet is applied to each semiconductor wafer 10 by means of a roller. In this method, although after-curing is carried out in a separate step by batch processing, an advantage such that the thickness can be accurately controlled is provided.

Next, referring to FIG. 6, in order to provide an electrical connection with semiconductor elements 19 to be mounted on the insulating layer 15, the insulating layer 15 is partially removed to provide holes 16. The conductive wiring layer 11A exposed through the bottom portion of the holes 16 represents parts to become bonding pads. If the insulating layer 15 is made of a photosensitive material, the holes 16 can be formed by partially removing the second insulating layer 15 in a widely-known lithographic step. In addition, the holes 16 can also be formed by a laser. In this method, the insulating layer 15 is removed and the conductive wiring layer 11A is exposed through the bottom of the holes 16. As a laser, a carbon dioxide laser is preferred. In addition, if residue exists at the bottom portion of the aperture portion after the insulating layer 15 is evaporated by laser, this residue is removed by wet etching with sodium permanganate, ammonium persulfate or the like.

Next, referring to FIG. 7, a plated layer 21 is formed on the front surface of the conductive wiring layer 11A exposed through the holes 16 to become bonding pads. The plated layer 21 can be formed by adhering gold or silver by an electrolytic plating method, and in this case, the second conductive film 12 can be used as a plating electrode. At this time, the second conductive film 12 and the rear surface excluding a plating electrode lead-out portion are protected by a resist to avoid the plating from adhering. This resist is unnecessary in partial jig plating where a front-surface plating portion is surrounded by a jig.

Figure 8:
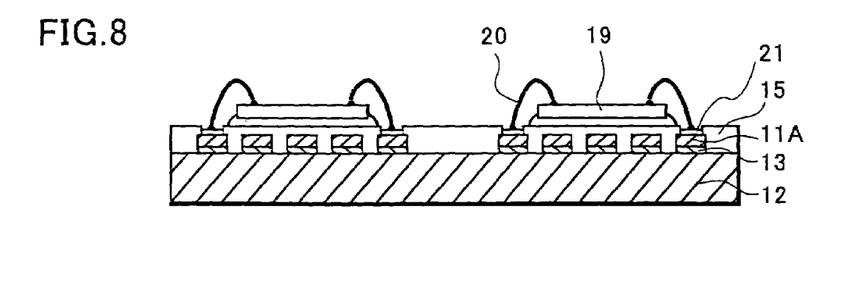
FIG. 8 is a sectional view describing a method for manufacturing circuit devices of the preferred embodiments.

The fifth step of the preferred embodiments is, as shown in FIG. 8, for fixedly fitting semiconductor elements 19 onto the insulating layer 15 and electrically connecting the semiconductor elements 19 with the conductive wiring layer 11A.

The semiconductor elements 19 are die-bonded in the state of bare chips onto the insulating layer 15 with an insulating adhesive resin. Since the semiconductor elements 19 are electrically insulated from the underlying conductive wiring layer 11A by the insulating layer 15, the conductive wiring layer 11A can be freely wired even below the semiconductor elements 19.

In addition, the respective electrode pads of the semiconductor element 19 are connected to bonding pads which are a part of the surrounding conductive wiring layer 11A via bonding wires 20. The semiconductor element 19 can be mounted face-down. In this case, solder balls or bumps are provided on the front surfaces of the respective electrode pads of the semiconductor element 19, while on the front surface of the laminated plate 10, electrodes similar to the bonding pads formed of the conductive wiring layer 11A are provided at parts corresponding to the solder ball positions.

Now, an advantage of using the laminated plate 10 in wire bonding will be described. In general, when wire bonding is carried out with Au wires, second conductive film 12 is heated up to 200° C.–300° C. At this time, if the second conductive film 12 is thin, the laminated plate 10 warps, and in this condition, if the laminated plate 10 is pressurized via a bonding head, there is a possibility that damage occurs to the laminated plate 10. However, these problems can be solved by forming the second conductive film 12 itself thick.

Figure 9:
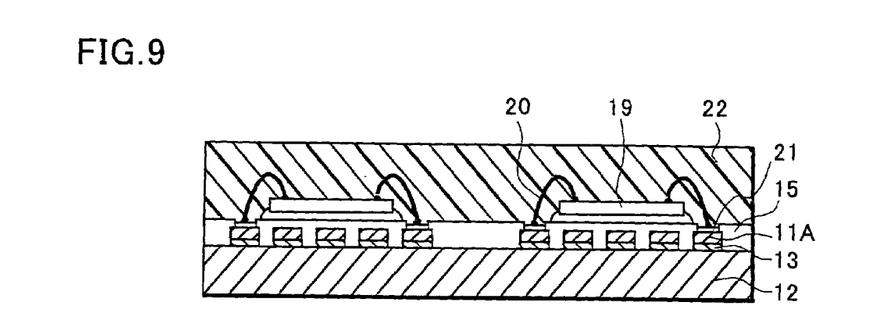
FIG. 9 is a sectional view describing a method for manufacturing circuit devices of the preferred embodiments.

The sixth step of the preferred embodiments is, as shown in FIG. 9, for covering the semiconductor elements 19 and bonding wires 20 with a sealing resin layer 22.

The laminated plate 10 is set in a molding device for resin molding. As a molding method, transfer molding, injection molding, coating, dipping and the like can be carried out. However, considering productivity, transfer molding and injection molding are suitable.

In this step, it is necessary that the laminated plate 10 is brought into contact flatly with a lower metal mold of a mold cavity, and the thick, second conductive film 12 performs this function. Moreover, even after removal from the mold cavity, flatness of the package is maintained by the second conductive film 12 until contraction of the sealing resin layer 22 is completely finished. Namely, a role of mechanically supporting the laminated plate 10 until this step is assumed by the second conductive film 12.

Figure 10:
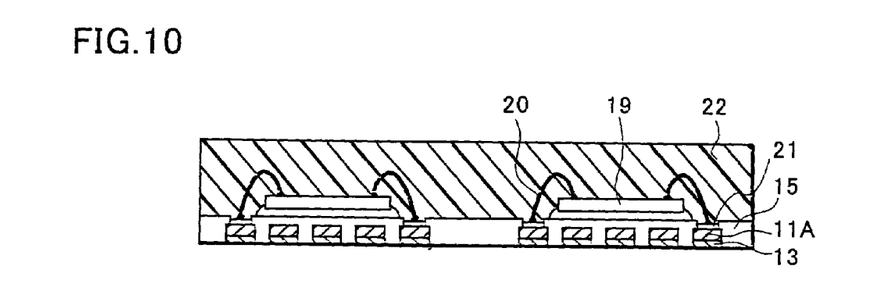
FIG. 10 is a sectional view showing a method for manufacturing circuit devices of the preferred embodiments.

The seventh step of the preferred embodiments is, as shown in FIG. 10, for removing the second conductive film 12 to expose the third conductive film 13 on the rear surface.

In this step, the second conductive film 12 is etched without masking so that the whole surface is removed. In this etching, chemical etching by use of ferric chloride or cupric chloride is sufficient, and the second conductive film 12 is entirely removed. By thus entirely removing the second conductive film 12, the third conductive film 13 is exposed through the insulating layer 15. As described above, since the third conductive film 13 is formed of a material which is not etched by a solution to etch the second conductive film 12, the third conductive film 13 is not etched in this step.

The preferred embodiments have an advantage that in a step where the second conductive layer 12 is removed by etching, the third conductive film 13 functions as a barrier layer, whereby a rear surface composed of the insulating layer 17 and third conductive film 13 is formed to be flat. Since the second conductive film 12 is entirely removed by etching, the third conductive film 13 also comes into contact with the etchant in the final stage of etching. As described above, the third conductive film 13 is formed of a material which is not etched by ferric chloride or cupric chloride that etch the second conductive film 12 made of Cu. Accordingly, since etching stops at the lower surface of the third conductive film 13, the third conductive film 13 functions as an etching barrier layer. Moreover, in and after this step, the ensemble is mechanically supported by the sealing resin layer 22.

Figure 11:
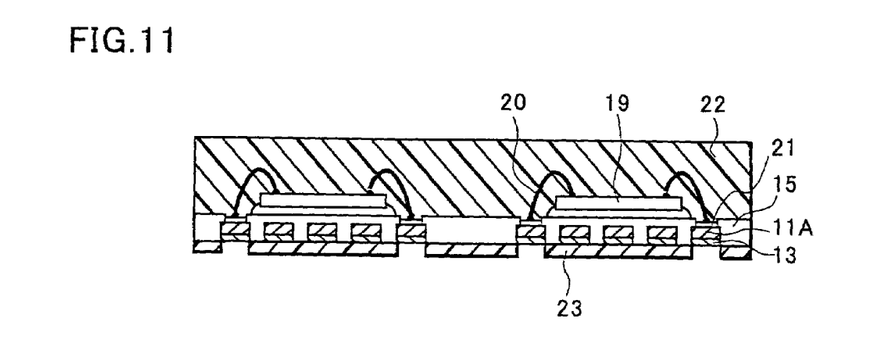
FIG. 11 is a sectional view showing a method for manufacturing circuit devices of the preferred embodiments.
Figure 12:
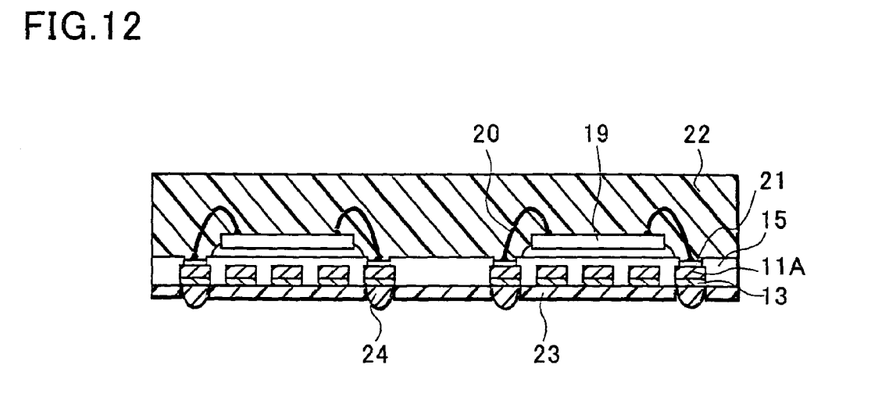
FIG. 12 is a sectional view showing a method for manufacturing circuit devices of the preferred embodiments.
Figure 13:
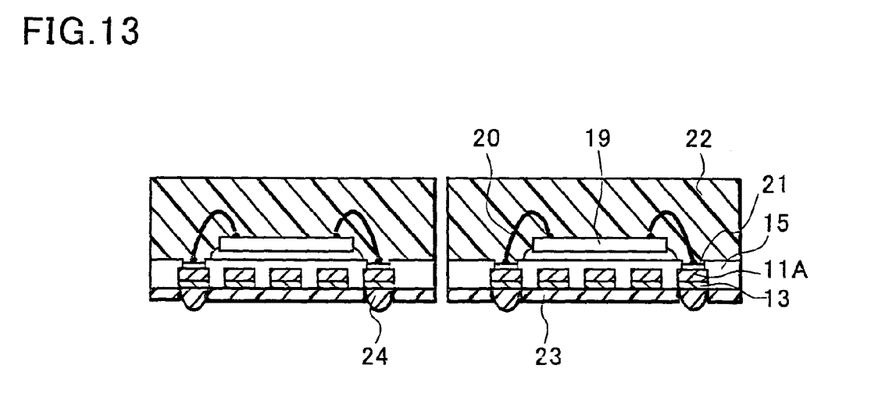
FIG. 13 is a sectional view describing a method for manufacturing circuit devices of the preferred embodiments.

The eighth step of the preferred embodiments is, as shown in FIG. 11 through FIG. 13, for forming external electrodes 24 at desirable positions of the third conductive film 13.

At this time, for use in an environment where Ag migration is considered to be a problem, it is preferable to remove the third conductive film 13 by selective etching before covering the conductive film 13 with an overcoat resin. First, referring to FIG. 11, the third conductive film 13 is, for the most part, covered with an overcoat resin 23 by screen printing with an epoxy resin dissolved in a solvent while exposing parts which form external electrodes 24. Next, referring to FIG. 12, external electrodes 24 are formed in these exposed parts by screen printing with a solder cream or by a solder reflow.

Lastly, referring to FIG. 13, since a large number of circuit devices are formed on the laminated plate 10 in a matrix form, these are separated into individual circuit devices by dicing the sealing resin layer 22 and overcoat resin 23.

In this step, since individual circuit devices can be separated by dicing the sealing resin layer 22 and overcoat resin 23, frictional wear of a dicer to perform dicing can be reduced.

Figure 14:
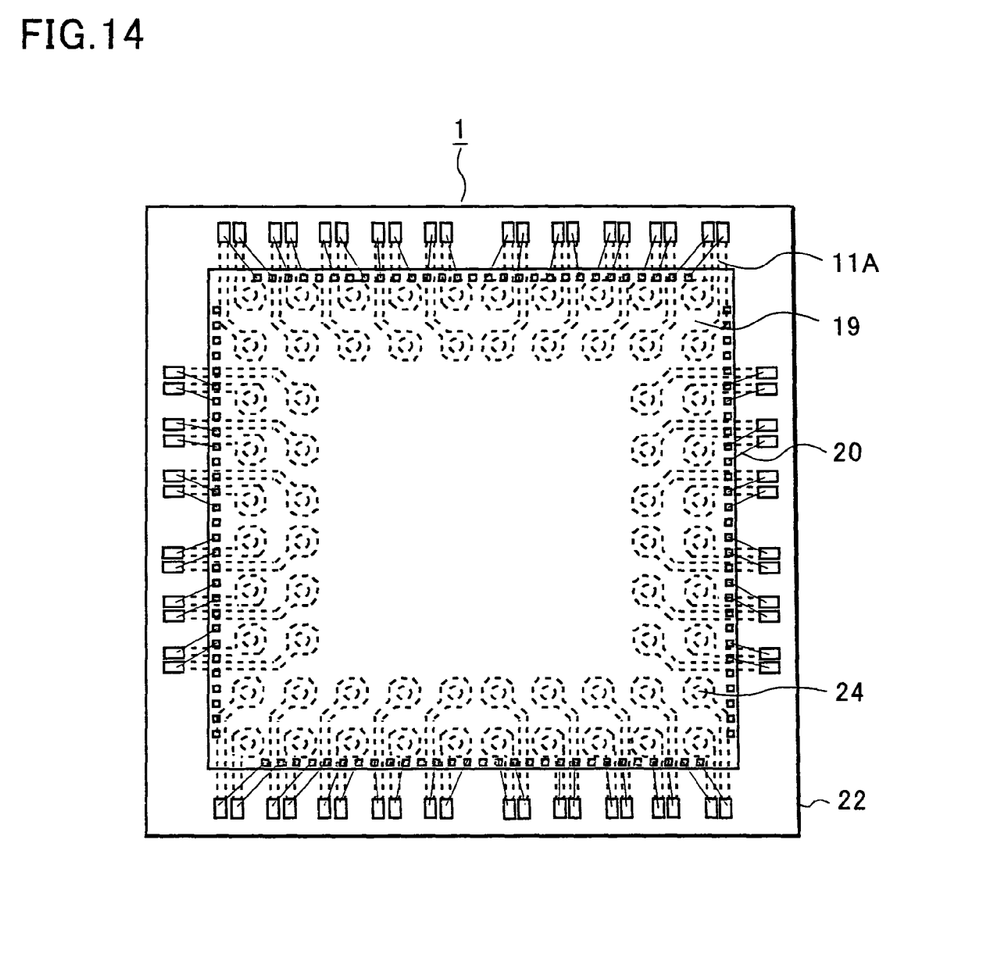
FIG. 14 is a plan view showing a circuit device manufactured according to the preferred embodiments.

With reference to FIG. 14, a concrete circuit device according to a manufacturing method of the preferred embodiments will be described. The pattern shown by dotted lines is a conductive wiring layer 11A. In a manner so as to surround the semiconductor element 19, bonding pads formed of the conductive wiring layer 11A are provided, while pads formed of the conductive wiring layer 11A are formed in a region below the semiconductor element 19. Herefrom, it is understood that a pattern formed of the conductive wiring layer 11A can be formed in the region below the semiconductor element 19 as well. In addition, the conductive wiring layer 11A can form a fine pattern, therefore, more external electrodes 24 can be formed.

With such a structure, even a semiconductor element 19 having 200 pads or more, a finely patterned, desirable conductive pattern can be formed by utilizing the fine pattern of the conductive wiring layer 11A, therefore, connection from external electrodes 24 to an external circuit can be carried out.

Figure 15:
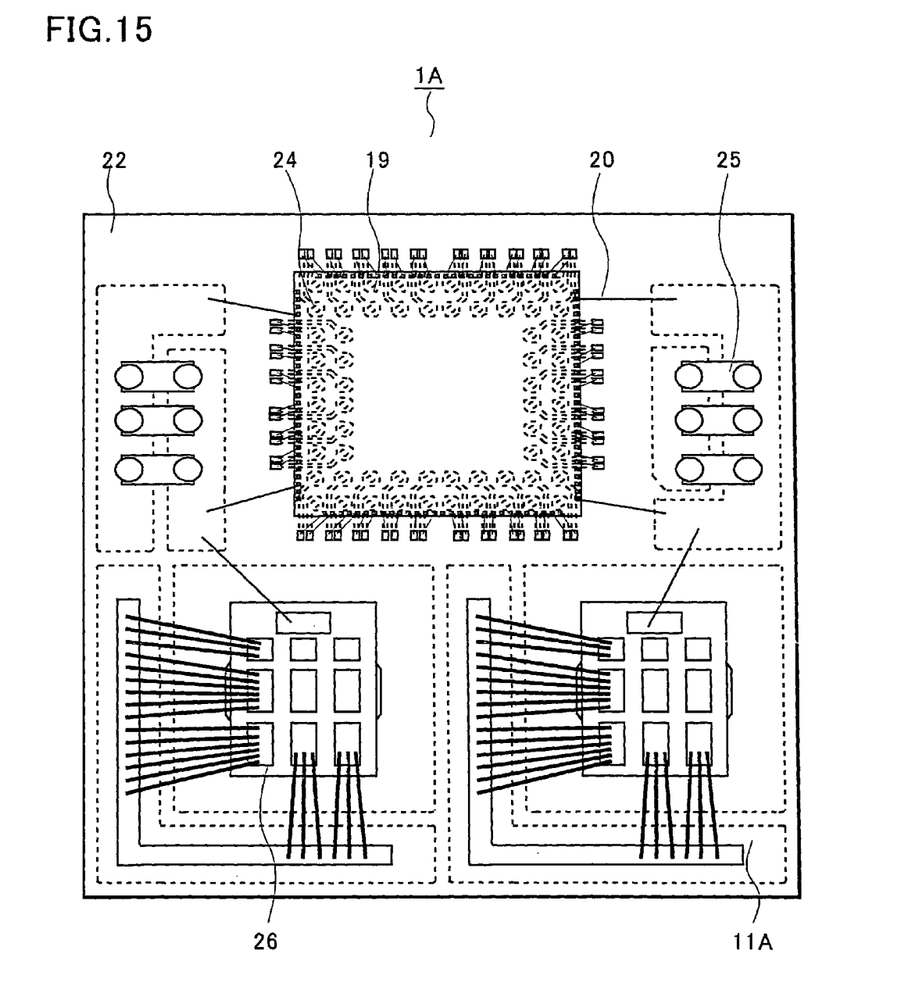
FIG. 15 is a plan view illustrating a circuit device manufactured according to the preferred embodiments.

With reference to FIG. 15, a concrete circuit device 1A of another embodiments will be described. Herein, in the circuit device 1A, a conductive wiring layer 11A shown by dotted lines is formed, and a semiconductor element 19, chip elements 25, and bare transistors 26 are mounted on the conductive wiring layer 11A. For the chip elements 25, passive components and active components such as resistors, capacitors, diodes, and coils can be employed in general. In addition, built-in components are electrically connected to each other via the conductive wiring layer 11A or bonding wires 20.

What is claimed is:

1. A method for manufacturing circuit devices comprising:
   preparing a laminated plate by laminating a first conductive film and a second conductive film via a third conductive film;
   forming a conductive wiring layer by etching said first conductive film into a pattern;
   removing said third conductive film by use of said conductive wiring layer as a mask;
   covering front-surface portions of the second conductive film exposed by removing said third conductive film, said conductive wiring layer, and end faces of the third conductive film with an insulating layer;
   partially exposing said conductive wiring layer by removing a part of said insulating layer;
   fixedly fitting semiconductor elements onto said insulating layer and electrically connecting said semiconductor elements with said conductive wiring layer;
   covering said semiconductor elements with a sealing resin layer; and
   removing said second conductive film to expose said third conductive film on the rear surface.

2. The method for manufacturing circuit devices as set forth in claim 1, wherein, in a step of etching said first conductive film, said conductive wiring layer is formed by performing etching up to said third conductive film.

3. The method for manufacturing circuit devices as set forth in claim 2, wherein, in the step of etching said first conductive film, said first conductive film is etched with a solution.

4. The method for manufacturing circuit devices as set forth in claim 2 or 3, wherein, in the step of etching said first conductive film, a solution containing ferric chloride or cupric chloride is used to etch the first conductive film.

5. The method for manufacturing circuit devices as set forth in claim 1, wherein, in a step of removing said third conductive film, said third conductive film is removed by electrolytic peeling.

6. The method for manufacturing circuit devices as set forth in claim 1, wherein, in a step of removing said third conductive film, said third conductive film is removed by using a solution to etch said third conductive film.

7. The method for manufacturing circuit devices as set forth in claim 6, wherein said solution is an iodine-based solution.

8. The method for manufacturing circuit devices as set forth in claim 1, wherein, in a step of removing said second conductive film, said second conductive film is entirely etched.

9. The method for manufacturing circuit devices as set forth in claim 1, wherein said second conductive film is thicker than said first conductive film.

10. The method for manufacturing circuit devices as set forth in claim 1, wherein said insulating layer can be a thermoplastic resin, a thermosetting resin, or a photosensitive resin.

11. The method for manufacturing circuit devices as set forth in claim 1, wherein said first conductive film and said second conductive film are metals made of copper as a main material, and said third conductive film is a metal made of silver as a main material.

12. The method for manufacturing circuit devices as set forth in claim 1, wherein said laminated plate is manufactured by laminating said third conductive film and said first conductive film by electroplating while using said second conductive film as a base.

13. The method for manufacturing circuit devices as set forth in claim 1, wherein said laminated plate is formed by rolling.

14. The method for manufacturing circuit devices as set forth in claim 1, wherein electronic components, other than semiconductor components, are electrically connected to said conductive wiring layer.

15. The method for manufacturing circuit devices as set forth in claim 1, wherein said insulating layer is formed by vacuum press or vacuum lamination.

16. The method for manufacturing circuit devices as set forth in claim 1, wherein, in a step of partially exposing said conductive wiring layer, said insulating layer is partially removed by laser processing.

17. The method for manufacturing circuit devices as set forth in claim 1, wherein, in the step of partially exposing said conductive wiring layer, said insulating layer is partially removed by a lithographic method.

18. The method for manufacturing circuit devices as set forth in claim 1, wherein a plated layer is formed on the exposed parts of said conductive wiring layer by electrolytic plating in which the second conductive layer is used as an electrode.

19. The method for manufacturing circuit devices as set forth in claim 1, further comprising forming external electrodes at particular positions of said third conductive film.

* * * * *